US010615111B2

(12) United States Patent
Majumdar et al.

(10) Patent No.: US 10,615,111 B2
(45) Date of Patent: Apr. 7, 2020

(54) INTERPOSER FOR MULTI-CHIP ELECTRONICS PACKAGING

(71) Applicant: The Board of Trustees of the Leland Stanford Junior University, Palo Alto, CA (US)

(72) Inventors: Arunava Majumdar, Menlo Park, CA (US); Seid H. Sadat, San Francisco, CA (US); Dusan Coso, Daly City, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 469 days.

(21) Appl. No.: 14/929,479

(22) Filed: Nov. 2, 2015

(65) Prior Publication Data

US 2016/0126159 A1    May 5, 2016

Related U.S. Application Data

(60) Provisional application No. 62/073,228, filed on Oct. 31, 2014.

(51) Int. Cl.
*H01L 23/373*    (2006.01)
*H01L 23/498*    (2006.01)
(Continued)

(52) U.S. Cl.
CPC .... *H01L 23/49894* (2013.01); *H01L 23/3677* (2013.01); *H01L 23/3738* (2013.01); *H01L 2924/0002* (2013.01)

(58) Field of Classification Search
CPC . H01L 21/481; H01L 21/4853; H01L 21/486; H01L 21/4889; H01L 21/6835;
(Continued)

(56) References Cited

U.S. PATENT DOCUMENTS 5,174,153 A * 12/1992 Nakano ............... G01F 23/22
                                                340/622
6,061,241 A *  5/2000 Handforth ............ H04M 3/005
                                                174/250

(Continued)

OTHER PUBLICATIONS

Brunschwiler, et al., "Enhanced Electrical and Thermal Interconnects by the Self-assembly of Nanoparticle Necks Utilizing Capillary Bridging", "Proceedings of the ASME 2013 International Technical Conference and Exhibition on Packaging and Integration of Electronic and Photonic Microsystems;", Jul. 16-18, 2013, pp. 1-10, Publisher: ASME; IPACK2013-73092, Published in: US.

(Continued)

*Primary Examiner* — Timothy J Thompson
*Assistant Examiner* — Guillermo J Egoavil
(74) *Attorney, Agent, or Firm* — Kaplan Breyer Schwarz, LLP

(57) ABSTRACT

An interposer for vertically separating device die is disclosed. The interposer includes a compliant layer comprising a plurality of thermally conductive plugs that are physically disconnected within the plane of the compliant layer, where the space between the plugs is filled with a compliant medium. In some embodiments, at least one of the top and bottom surfaces of the compliant layer is coated with a thin layer of electrically insulating material.

13 Claims, 9 Drawing Sheets

(51) Int. Cl.
*H05K 3/00* (2006.01)
*H05K 3/10* (2006.01)
*H05K 3/46* (2006.01)
*H01L 23/367* (2006.01)

(58) Field of Classification Search
CPC .......... H01L 21/76898; H01L 23/3677; H01L 23/49894; H01L 23/3738; H01L 23/0091; H01L 23/49822; H01L 23/373; H01L 23/498; H01L 23/481; H01L 23/49827; H01L 23/3731; H01L 24/43; H01L 24/46; H01L 2221/68345; H01L 2221/68359; H01L 2224/023; H01L 2224/4502; H01L 2924/0002; H01L 2924/00; H01L 2924/00014; H01L 2924/15311; H05K 3/00; H05K 3/10; H05K 3/46; H05K 3/4644; H05K 3/0091; H05K 361/748; H05K 257/696
USPC .......................................... 361/748; 257/696
See application file for complete search history.

(56) References Cited

U.S. PATENT DOCUMENTS

| | | | | |
|---|---|---|---|---|
| 6,117,797 A * | 9/2000 | Hembree | ............ | H01L 21/4871 257/E23.125 |
| 6,241,532 B1 * | 6/2001 | Howell | ................ | H05K 3/365 439/66 |
| 6,524,115 B1 * | 2/2003 | Gates | ................ | G01R 1/0408 439/66 |
| 6,525,407 B1 * | 2/2003 | Drewery | ............ | H01L 21/4846 257/666 |
| 2003/0015803 A1 * | 1/2003 | Prietzsch | ............ | H01L 24/32 257/777 |
| 2003/0117087 A1 * | 6/2003 | Barth | ................ | H05B 33/0815 315/291 |
| 2004/0203312 A1 * | 10/2004 | Bortscheller | ......... | H01L 33/508 445/24 |
| 2005/0189639 A1 * | 9/2005 | Tanie | ................ | H01L 25/0657 257/686 |
| 2005/0276958 A1 * | 12/2005 | Komurasaki | .......... | B32B 15/14 428/209 |
| 2006/0045421 A1 * | 3/2006 | Baets | ................ | G02B 6/4201 385/33 |
| 2008/0001271 A1 * | 1/2008 | Marcinkiewicz | ... | H01L 25/0657 257/678 |
| 2008/0157361 A1 * | 7/2008 | Wood | ................ | B81B 7/0006 257/738 |
| 2009/0095076 A1 * | 4/2009 | Tamura | ................ | G01P 1/006 73/497 |
| 2010/0231251 A1 * | 9/2010 | Nelson | ................ | G01R 1/0466 324/755.09 |
| 2010/0269336 A1 * | 10/2010 | Mayder | ............... | H05K 1/0206 29/852 |
| 2011/0115082 A1 * | 5/2011 | Gluschenkov | ........ | H01L 21/486 257/738 |
| 2011/0285005 A1 * | 11/2011 | Lin | ................... | H01L 21/4846 257/686 |
| 2012/0020027 A1 * | 1/2012 | Dungan | ............... | H01L 25/0652 361/718 |
| 2012/0032350 A1 * | 2/2012 | Warren | ............... | H01L 23/4334 257/782 |
| 2012/0126399 A1 * | 5/2012 | Lin | ........................ | H01L 21/56 257/737 |
| 2012/0189836 A1 * | 7/2012 | Kruglick | ................ | B01D 57/02 428/292.1 |
| 2012/0193811 A1 * | 8/2012 | Yang | ..................... | H01L 21/486 257/774 |
| 2012/0314367 A1 * | 12/2012 | Zhao | ....................... | H01L 23/36 361/695 |
| 2013/0330747 A1 * | 12/2013 | Malima | ............ | G01N 33/54346 435/7.92 |
| 2014/0306349 A1 * | 10/2014 | Gu | ..................... | H01L 23/49827 257/774 |
| 2015/0092314 A1 * | 4/2015 | Kim | ....................... | H01F 27/29 361/270 |
| 2015/0102313 A1 * | 4/2015 | Heo | .................... | H01L 27/3248 257/40 |
| 2015/0115467 A1 * | 4/2015 | Park | ..................... | H01L 23/3128 257/774 |
| 2015/0130045 A1 * | 5/2015 | Tseng | .................... | H01L 23/36 257/712 |
| 2015/0228916 A1 * | 8/2015 | Bulovic | ............. | H01L 51/0097 136/259 |
| 2015/0303173 A1 * | 10/2015 | Maydar | ............. | H01L 23/49827 257/664 |
| 2015/0340327 A1 * | 11/2015 | Uzoh | .................... | H01L 24/02 257/723 |
| 2015/0348873 A1 * | 12/2015 | Katkar | .................. | H01L 23/481 257/774 |
| 2016/0020353 A1 * | 1/2016 | Chu | .................. | H01L 31/02327 257/21 |

OTHER PUBLICATIONS

Brunschwiler, et al., "Formulation of Percolating Thermal Underfills Using Hierarchical Self-Assembly of Microparticles and Nanoparticles by Centrifugal Forces and Capillary Bridging", "Journal of Microelectronics and Electronic Packaging", 2012, pp. 149-159, vol. 9, No. 4, Publisher: International Microelectronics and Packaging Society; ISBN: 1551-4897; doi:10.407/imaps.357, Published in: US.

S.A. Ha, et al, "Thermal conductivity of graphite filled liquid crystal polymer composites and theoretical predictions", "Composites Science and Technology", 2013, pp. 113-119, No. 88, Publisher: Elsevier Ltd.; http://dx.doi.org/10.1016/j.compscitech.2013.08.022, Published in: US.

* cited by examiner

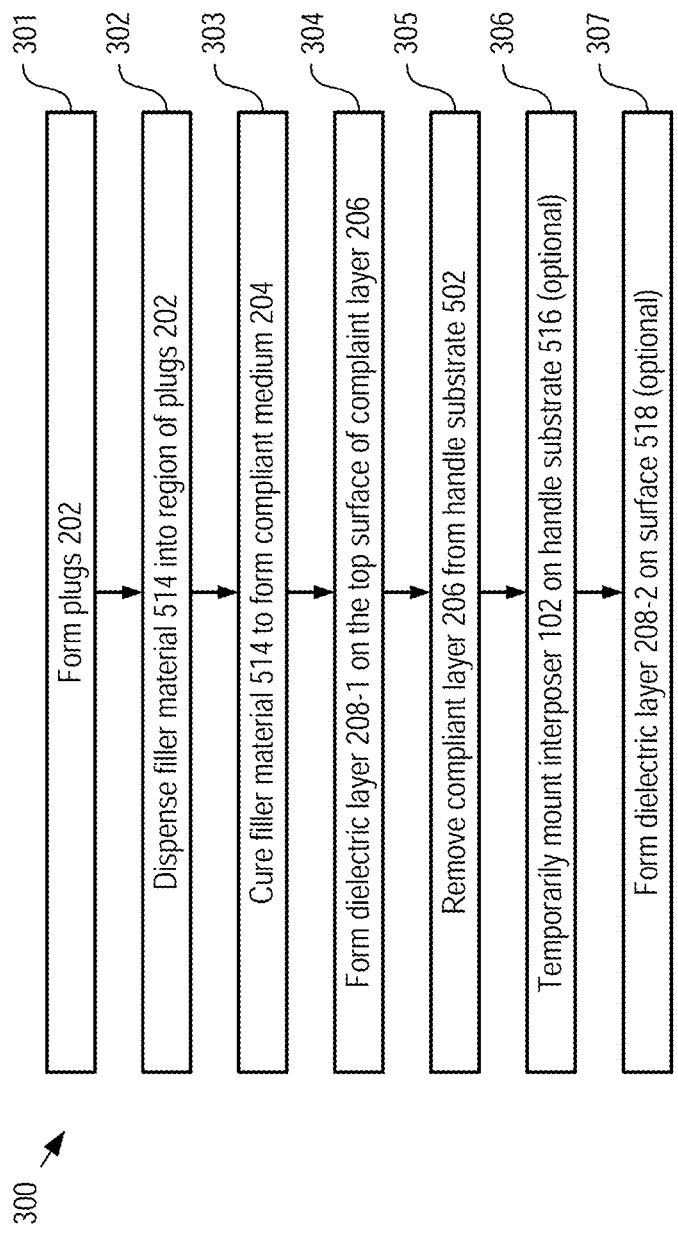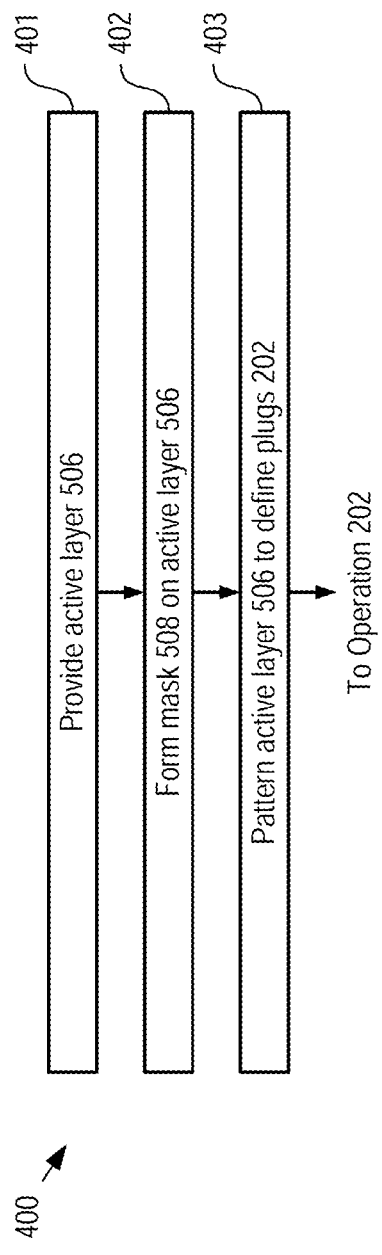

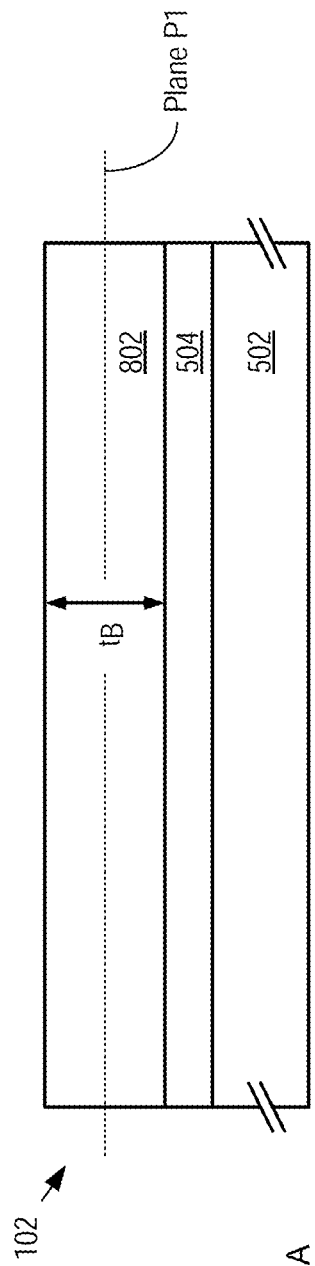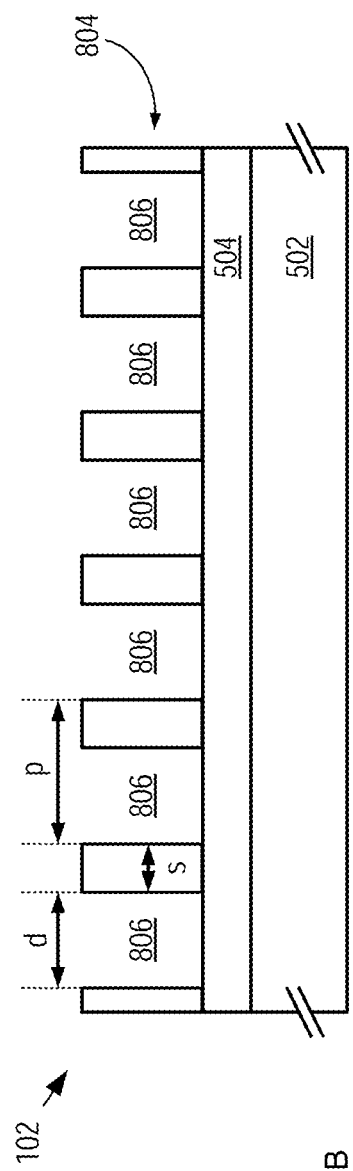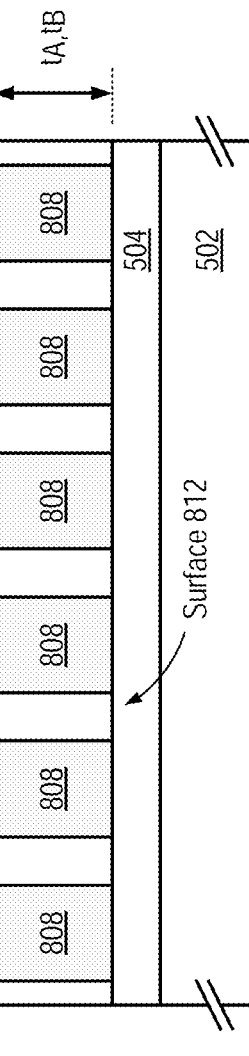
FIG. 8A
FIG. 8B
FIG. 8C

FIG. 10

| Component | Material | Thickness | In-Plane Characteristic Length | Thermal Conductivity (W/m·K) | Thermal Conductance $10^6$ (W/K·m²) | Thermal Conductance per Area (W/K·cm²) |
|---|---|---|---|---|---|---|
| A | Silicon | 20 μm | 50 x 50 μm² | 150 | 3.83 | 382 |
| B | Parylene | 20 μm | 20 x 50 μm² | 0.082 | 2.01 | 200 |
| C | PMMA | 50 nm | - | 0.2 | 4.00 | 400 |
| Interposer 202 | | 20.1 μm | - | 26.2 | 1.30 | 131 |
| Benchmark | | 20 μm | - | 5 | 0.25 | 25 |

INTERPOSER FOR MULTI-CHIP ELECTRONICS PACKAGING

CROSS REFERENCE TO RELATED APPLICATIONS

This case claims priority of U.S. Provisional Patent Application Ser. No. 62/073,228, filed Oct. 31, 2014, which is incorporated herein by reference. If there are any contradictions or inconsistencies in language between this application and one or more of the cases that have been incorporated by reference that might affect the interpretation of the claims in this case, the claims in this case should be interpreted to be consistent with the language in this case.

FIELD OF THE INVENTION

The present invention relates to packaging in general, and, more particularly, to electronics packaging.

BACKGROUND OF THE INVENTION

Inter-chip communication bandwidth limitations threaten the continued growth in the amount of data that can be handled by conventional electronics. The demand for such bandwidth appears insatiable, doubling every three years (driven largely by the growth in multimedia communications). Although intra-chip integrated-circuit (IC) density has been doubling approximately every two years, a practical chip-size limit has led to many electronic systems having their functionality distributed across multiple integrated-circuit die. Unfortunately, the ability to communicate at high rates between chips has not been keeping pace with the bandwidth demand.

Aggregate inter-chip communications rates are limited, in part, by electrical and thermal considerations of the interconnect technology used to combine the different die on a common underlying substrate. The most dominant chip-to-chip interconnect technology is wire bonding, wherein lengths of small-diameter wires are bonded to input/output pads located on the periphery of the different IC chips. Unfortunately, the amount of periphery available for bond pads is limited and wire bonding to bond pads located in the interior of a chip is complex and expensive. In addition, wire bonds must be spaced somewhat sparsely to mitigate electrical cross-talk between them, as well as to provide room for the bonding equipment used to attach the wires to the chips. Further, wire bonds are normally quite long and characterized by high parasitic electrical inductance, which limits the frequency of the signals each wire bond can carry. Finally, significant power is needed to drive electrical signals over wire bonds, which leads to a need for relatively high power dissipation by the input/output pad driver circuits used. This power dissipation gives rise to heat that must be effectively removed for proper circuit operation.

Alternative packaging approaches have been developed to mitigate some of these problems. One such alternative technology is the ball-grid array-based (BGA-based) multi-chip module, which relies upon two-dimensional arrays of solder bumps formed on bond pads distributed throughout the area of an IC die. In some cases, the ball grid is formed on the same surfaces as the circuit elements of each semiconductor die and the chips are flipped over and bonded to an array of bond pads located on the common substrate. In other BGA approaches, electrically conductive "pipes" are formed through the thickness of the individual die substrates. These "through-wafer vias" enable the chips to be bonded, right-side-up, to the bond pads of their common substrate.

Solder bumps are characterized by lower inductance than conventional wire bonds due, in part, to the short distance of the electrical interconnect. In addition, solder bumps can be formed with higher density than wire bonds, and can be located within the interior of the IC chip. As a result, BGA-based packaging enables a significant improvement in aggregate I/O bandwidth over that of wire-bond based packaging.

While BGA-based packaging technology represents a significant advance over wire-bond-based multi-chip packaging, it is primarily limited to "2.5D" layouts (a single layer of attached die) and has significant shortcomings as well. First, the solder bumps serve a dual purpose in that they both electrically interconnect and physically join the individual die to the common substrate. As the semiconductor die heat up during operation, however, individual die undergo thermal expansion that changes the spacing of their bond pads. This places physical stress on the solder bumps, which lead to reliability issues and even catastrophic failure of the solder joints. This differential thermal expansion issue is particularly troubling for die have substrates of different materials, such as multi-chip modules containing silicon-based circuitry and compound-semiconductor-based optoelectronic chips.

Second, the degree of compression imparted on the solder bumps during bonding must be carefully controlled to effect suitable electrical connectivity without causing damage to the bonded die or the receiving substrate.

Third, the heat transfer capability of BGA-based packaging is limited by the total cross-sectional area of the solder bumps themselves, since the surfaces of the die and substrate between the solder joints are not normally in physical contact.

Finally, the mechanical integrity of the packaged system relies solely on the strength of the solder bumps themselves.

Flowing a thermally conductive material into the open space between a bump-bonded die and its underlying substrate is used to enhance the mechanical integrity of a package and facilitating conduction of heat from the bonded die to the common substrate.

While conventional underfill materials are seen as an improvement, their thermal conductivity has typically been relatively poor. As a result, efforts to increase the thermal conductivity of underfill materials is ongoing. For example, Ha, et al. reported liquid-dispensed underfill materials comprising adhesive-resins impregnated with high-thermal-conductivity constituents (e.g., graphene) in "Thermal conductivity of graphite filled liquid crystal polymer composites and theoretical predictions," *Compos. Sci. Tech.*, Vol. 88, pp. 113-119 (2013). Similarly, Brunschwiler, et al., reported on liquid-dispensed underfill materials suitable for forming interfacial layers between stacked die, where the underfill material includes thermally conductive filler particles that are physically connected by nanoparticle-based bridges in "Formulation of Percolating Thermal Underfills Using Hierarchical Self-Assembly of Microparticles and Nanoparticles by Centrifugal Forces and Capillary Bridging," *J. Microelectron. Electron. Packag.*, Vol. 9, pp. 149-159 (2012) and "Enhanced Electrical and Thermal Interconnects by the Self-Assembly of Nanoparticle Necks Utilizing Capillary Bridging," *J. Electron. Packag.*, Vol. 136, pg. 41012, (2014).

Unfortunately, while such approaches are conceptually attractive, they have yet to be demonstrated in practical packaging systems. Each of these prior-art approaches suffers from the lack of a technique for precise manipulation and controllable placement of high thermal conductivity materials, where the technique is easily scalable to large macro-scale areas.

As the drive toward ever-higher integration density continues, additional layers of active die are being placed in the vertical space above a common substrate, giving rise to three-dimensional (3D) packaging (a.k.a., vertical integration). Unfortunately, as the number of layers of active devices increases, the problems outlined above become more challenging. In particular, it becomes even harder to remove heat generated by active circuitry, which exacerbates the difficulty of accommodating the thermal expansion of individual chips. Low thermal conductance between vertically integrated device dies is considered to be a principal bottleneck for thermal management and currently available underfill materials are seen as inadequate.

A practical means of simultaneously providing good thermal conductivity, electrical insulation and mechanically compliance between semiconductor die of a vertically stacked electronics package remains unrealized in the current state of the art.

SUMMARY OF THE INVENTION

The present invention enables packaging for semiconductor die that is scalable and has substantially reduced thermal contact resistance between individual die and interposer material. As a result, a package in accordance with the present invention has improved overall heat-transfer capability as compared to the prior art.

Embodiments of the present invention include one or more preformed interposers having a spatial architecture that provides high-effective-thermal conductivity through the thickness of the interposer, while also satisfying the often-conflicting requirements of directional structural strength and flexibility. Embodiments of the present invention are particularly well suited for use in packaging hybrid material micro/nanostructures, multi-chip modules, optoelectronic modules containing chips of multiple substrate materials, optical sub-assemblies, and the like.

An illustrative embodiment of the present invention is an interposer having a mixture of highly thermally conductive silicon plugs immersed in a compliant medium of Parylene. The silicon plugs and Parylene collectively define a substantially compliant layer that readily conveys heat through its thickness. The compliant layer is sandwiched between two layers of electrically insulating poly(methyl methacrylate) to complete the interposer.

In some embodiments, the thermally conductive plugs are physically disconnected regions of a thermally conductive material that has been patterned to define the regions. In some embodiments, the thermally conductive material is a different semiconductor. In some embodiments, the thermally conductive material is a metal. In some embodiments, the thermally conductive material is a composite material.

In some embodiments, the compliant medium is a different polymer, such as polydimethylsiloxane.

In some embodiments, at least one of the electrically insulating layers disposed on the compliant layer includes a different dielectric material, such as hydrogen silsesquioxane, or another insulating polymer.

An embodiment of the present invention is an interposer comprising: a compliant layer that has thermal conductivity in a first direction that is higher than the thermal conductivity within a first plane that is substantially orthogonal with the first direction; and a first layer disposed on a first surface of the compliant layer, the first layer being electrically insulating.

BRIEF DESCRIPTION OF THE DRAWINGS

FIG. 3 depicts operations of a method for forming an interposer in accordance with the illustrative embodiment.

FIG. 4 depicts sub-operations of a sub-method suitable for forming plugs 202.

FIGS. 8A-C depict schematic diagrams of cross-sectional views of an interposer at different stages of its fabrication in accordance with the alternative embodiment of the invention.

FIG. 10 depicts a table of exemplary materials, dimensions, and material characteristics for an interposer in accordance with the present invention and a benchmark layer of conventional underfill materials.

DETAILED DESCRIPTION

It is an aspect of the present invention that a practical pre-formed interposer for thermally coupling semiconductor die in a vertical stack enables more realizable vertically integrated electronics packages. A suitable interposer must simultaneously provide good thermal conductivity between chips, electrical insulation, and mechanical compliance over long periods of time and over large temperature ranges. In order for an interposer to be useful in such an application, therefore, it must meet several requirements. First, it must provide high effective-out-of-plane thermal conductivity—preferably greater than 5 W/m·K. In addition, it must be mechanically compliant in the lateral dimension (i.e., in-plane) so that it can accommodate differential thermal expansion of the structures affixed to its opposing (top and bottom) surfaces. It must also have good out-of-plane stiffness (>5 GPa) so that it can offer protection to the circuit elements and interconnects that populate its attached die and/or common substrate. At the same time, it must have sufficient compliance that it can accommodate warpage of the die and/or substrate (within the range of approximately 50 microns to approximately 100 microns). Finally, its formation must be within a thermal budget tolerable for the circuit elements of the package. For example, all layers must be curable with a heat treatment of less than 200° C. for less than about 1 to 2 hours.

Figure 1:
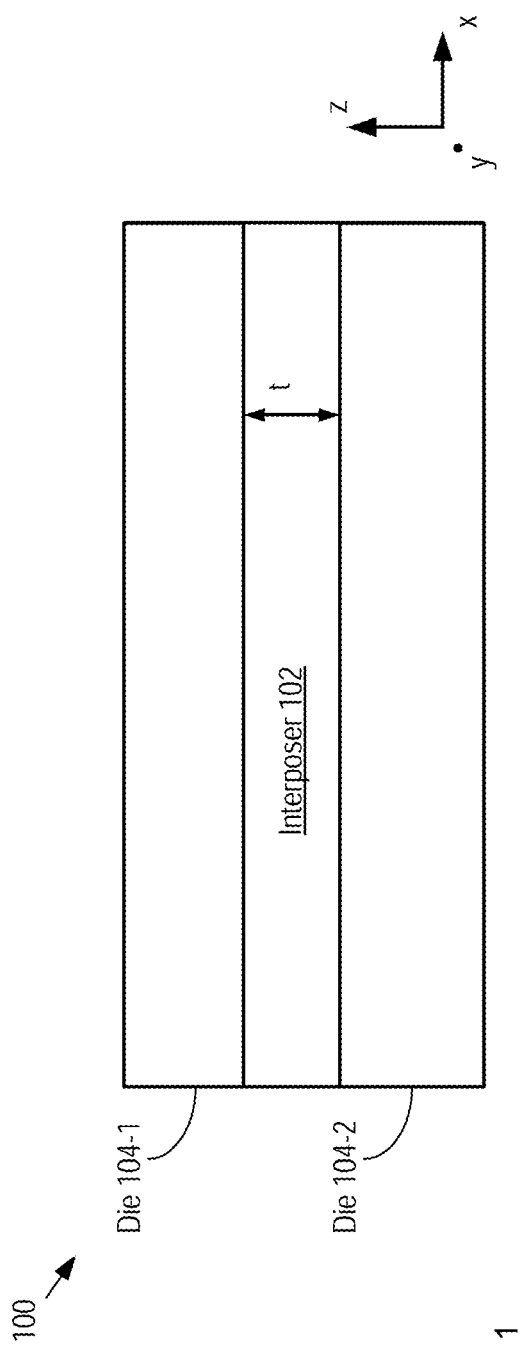
FIG. 1 depicts a schematic diagram of a three-dimensional electronics package in accordance with an illustrative embodiment of the present invention.

FIG. 1 depicts a schematic diagram of a three-dimensional electronics package in accordance with an illustrative embodiment of the present invention. Package 100 includes interposer 102 and semiconductor dies 104-1 and 104-2.

Figure 2:
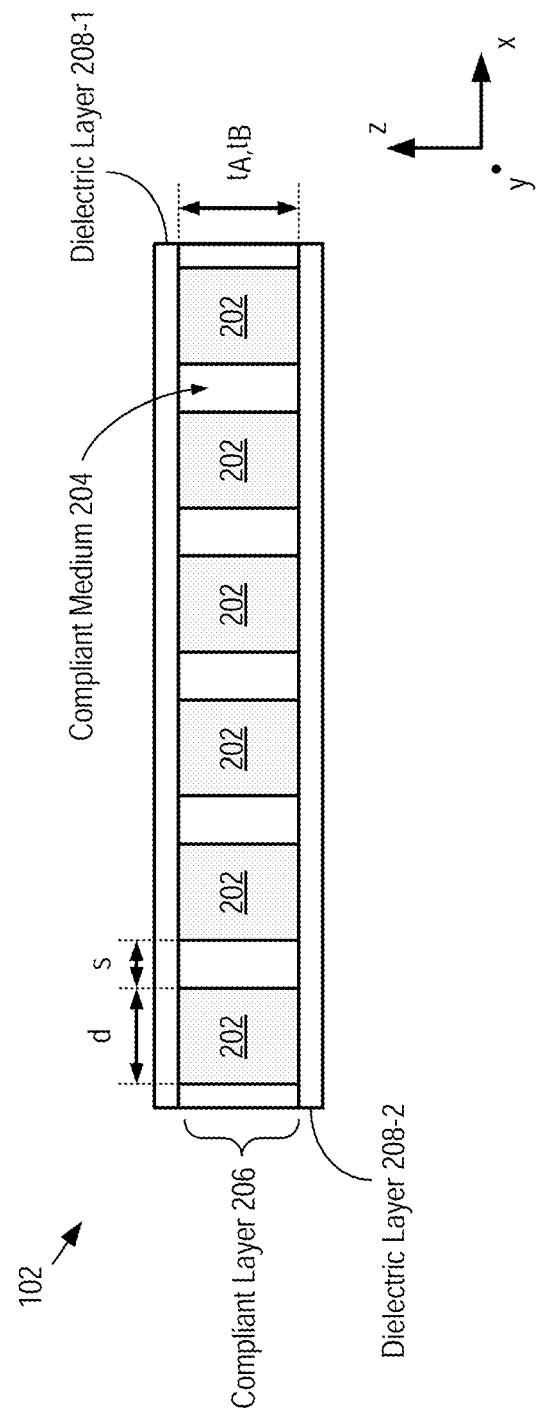
FIG. 2 depicts a schematic drawing of a detailed view of interposer 102.

FIG. 2 depicts a schematic drawing of a detailed view of interposer 102. Interposer 102 comprises a plurality of thermally conductive plugs 202, compliant medium 204, and dielectric layers 208-1 and 208-2. Plugs 202 and compliant medium 204 collectively define compliant layer 206, which is sandwiched between dielectric layers 208-1 and 208-2 (referred to, collectively, as dielectric layers 208).

FIG. 3 depicts operations of a method for forming an interposer in accordance with the illustrative embodiment. One skilled in the art will recognize that method 300 represents only one non-limiting example of a method for forming an interposer in accordance with the present invention. Method 300 begins with operation 301, wherein plugs 202 are formed.

FIG. 4 depicts sub-operations of a sub-method suitable for forming plugs 202. Sub-method 400 begins with sub-operation 401, wherein a thermally conductive starting layer is provided.

FIGS. 5A-F depict schematic drawings of cross-sectional views of interposer 102 at different stages of its fabrication.

Figure 5A:
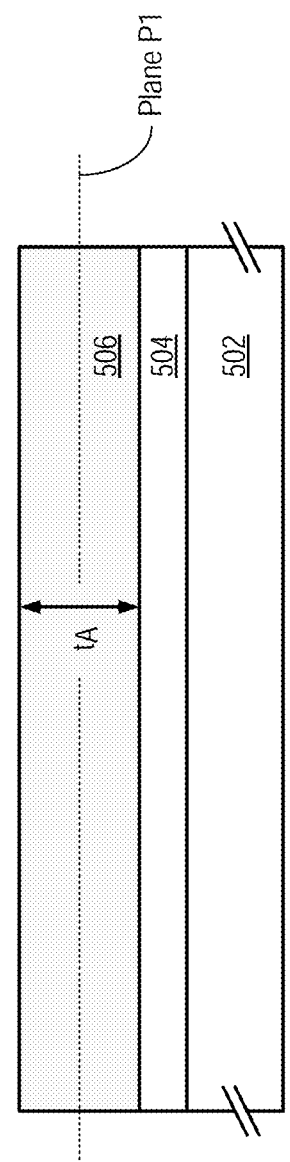
FIGS. 5A-F depict schematic drawings of cross-sectional views of interposer 102 at different stages of its fabrication.

FIG. 5A depicts a schematic drawing of a cross-sectional view of starting substrate 500. Substrate 500 includes handle wafer 502, release layer 504, and active layer 506. In the depicted example, substrate 500 is a conventional silicon-on-insulator (SOI) substrate suitable for use in integrated circuit fabrication.

Handle wafer 502 is a conventional silicon wafer. In some embodiments, handle wafer 502 is another substrate suitable for use in planar processing fabrication.

Release layer 504 is a buried oxide layer (BOX) of silicon dioxide having a thickness, $t_A$, of approximately 1 micron.

Active layer 506 is a substantially planar layer of thermally conductive material having a thickness, $t_A$, which is within the range of a few microns to several tens of microns. Active layer 506 defines plane, P1. For the purposes of this Specification, including the appended claims, the term "thermally conductive" is defined as having a thermal conductivity equal to or greater than 5 W/m·K. Preferably, however, active layer has a thickness within the range of approximately 10 microns to approximately 30 microns, and typically approximately 15 microns. In the depicted example, active layer 506 comprises single-crystal silicon; however, in some embodiments, active layer 506 comprises a different thermally conductive material. Materials suitable for use in active layer 506 include, without limitation, doped and undoped semiconductors (e.g., III-V compound semiconductors, II-VI compound semiconductors, germanium, silicon-germanium, silicon carbide, etc.), metals, compound materials, and the like. In some embodiments, active layer 506 is a layer of high thermal conductivity electrically insulating material, such as a single-crystal oxide (e.g., sapphire, etc.), and the like. Preferably, in such embodiments, thickness, $t_A$, is within the range of approximately 5 microns to approximately 20 microns to facilitate the transfer of heat through the interposer.

It should be noted that the dimensions provided above are merely exemplary and that it will be clear to one skilled in the art, after reading this Specification, how to specify, make, and use alternative embodiments wherein either of layers 504 and 506 has any practical thickness without departing from the scope of the present invention.

At sub-operation 402, mask 508 is formed on the surface of active layer 506. Mask 508 is typically formed via conventional photolithography; however, any other known masking method (e.g., hard mask, shadow mask, etc.) is within the scope of the present invention.

Figure 6:
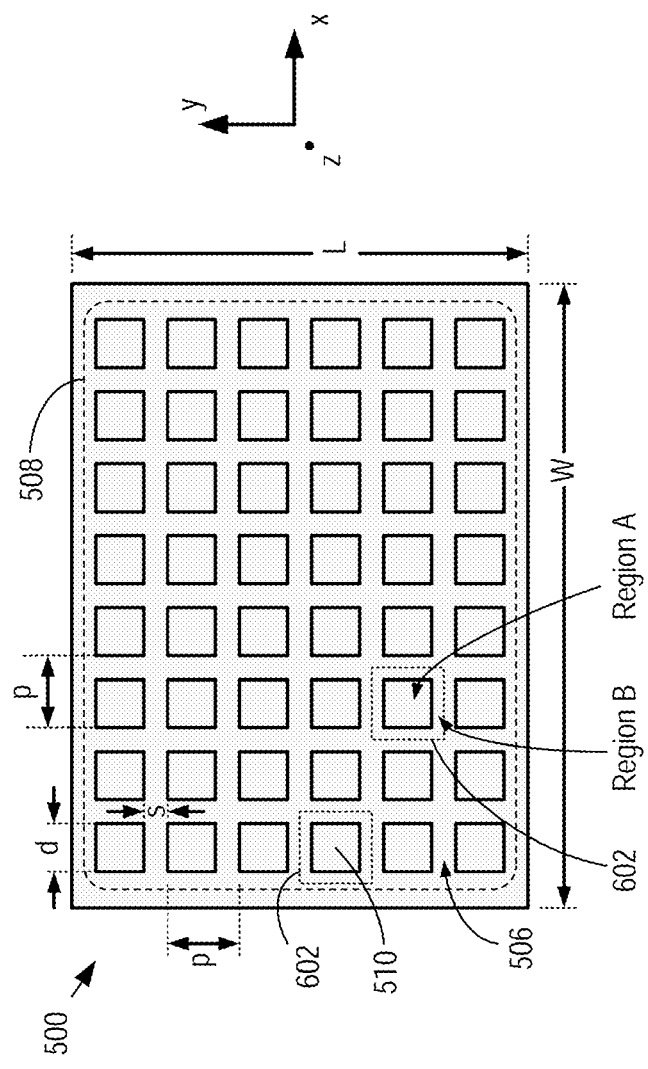
FIG. 6 depicts a schematic drawing of a top view of mask 508 disposed on active layer 506.

FIG. 6 depicts a schematic drawing of a top view of mask 508 disposed on active layer 506. Mask 508 is a two-dimensional arrangement of mask regions 510. In the depicted example, the arrangement is a two-dimensional array of square regions having width, d, and spaced by spacing, s, which gives a periodicity, p, in the x- and y-dimensions, thereby defining a plurality of unit cells 602. In some embodiments, at least one of mask regions 510 has a different shape, such as circular, rectangular, irregular, and the like. In some embodiments, mask regions 510 are arranged in an arrangement other than a two-dimensional array having uniform spacing in each dimension. In some embodiments, mask regions 510 are arranged in a one-dimensional arrangement.

At sub-operation 403, active layer 506 is patterned via etch 512 to define plugs 202, which have a substantially uniform final thickness of $t_A$, corresponding to the thickness of active layer 506. By virtue of the dimensions of mask 508, each of plugs 202 has a substantially square cross-sectional shape with sides of width d, and the plugs are arranged in a regular two-dimensional array with periodicity of p in each of the x- and y-dimensions. Etch 512 is a conventional directional deep-reactive-ion etch (DRIE) process suitable for etching silicon. In some embodiments, active layer 506 is patterned via another suitable etch process, such as wet etching, conventional RIE, and the like.

Figure 5B:
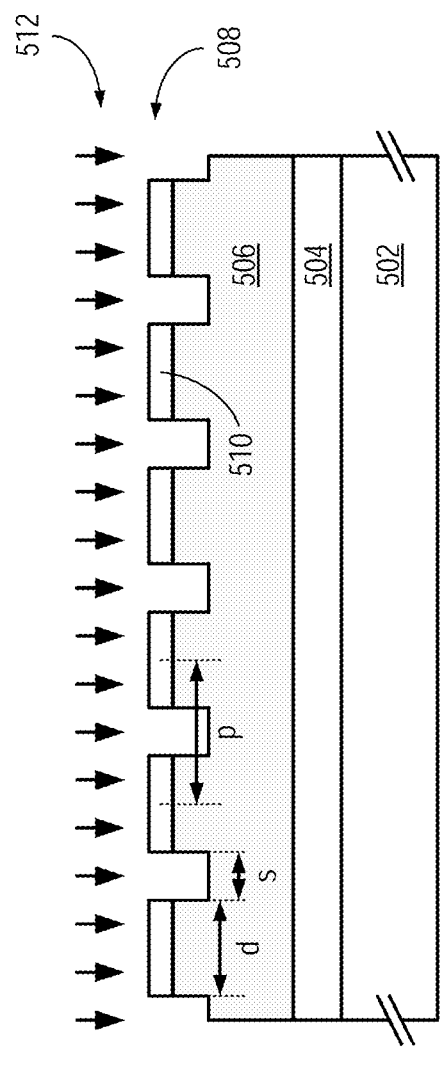
Figure 5C:
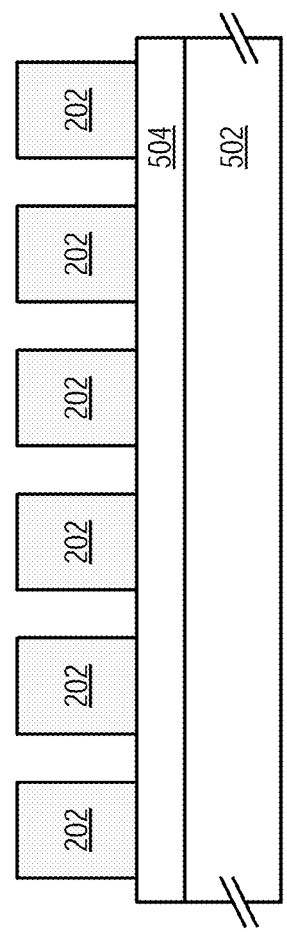

FIGS. 5B and 5C depict cross-sectional views of substrate 500 during and after, respectively, patterning of active layer 506 to define plugs 202.

Other suitable methods for forming plugs 202 in accordance with the present invention include, for example, forming a mold layer on a handle substrate, where the mold layer includes a plurality of cavities that correspond to the locations of the plugs. Once the mold layer is formed, the cavities are filled with an appropriate material (e.g., copper, nickel, etc.) using a conventional technique, such as, electroplating, electroforming, electroless plating, evaporation, sputtering, selective-area growth, and the like. In some embodiments, the mold layer is removed after the cavities are filled. In some embodiments, the mold layer comprises a compliant material that serves as compliant medium 204 after the cavities have been filled to form the plugs.

One skilled in the art will recognize, after reading this Specification, that the heat transfer capability of interposer 102 scales with the volume fraction of plugs 202 within compliant layer 206; however, the out-of-plane compliance of the interposer is inversely proportional to this volume fraction. As a result, the layout of mask 508 is a matter of design choice typically based on the tradeoff between thermal conductivity and compliance. Porosity factor, $\phi_A$, is defined herein as the ratio of the area of plug 202 to the total area of unit cell 602 within interposer 102 in the x-y plane (where the area of the plug is designated as region A and the remainder of the unit cell is designated as region B). This factor is calculated as:

$$\phi_A = \frac{d^2}{p^2}. \tag{1}$$

In the illustrative embodiment of system 100, for example, d=50 microns and p=70 microns, which results in $\phi_A$=0.51.

Returning now to method 300, at operation 302, filler material 514 is dispensed into the regions between plugs 202. Filler material 514 is a flowable material that, when cured, yields a material that is flexible and mechanically compliant. In the depicted example, compliant medium 204 is Parylene; however, one skilled in the art will recognize that myriad materials are suitable for use in compliant medium without departing from the scope of the invention.

Materials suitable for use in complaint medium 204 include, without limitation, conventional underfill materials having suitable compliance, other polymers (e.g., polydimethylsiloxane (PDMS), etc.), silicone, and the like.

Filler material 514 is dispensed by flowing it into the patterned active layer until it reaches nascent thickness $t_1$. Nascent thickness $t_1$ is based on the expected shrinkage of filter material 514 when the material is cured, as discussed below. In some embodiments, a predetermined volume of material is dispensed during operation 302.

At operation 303, filler material 514 is cured to form compliant medium 204 having surfaces 516 and 518. In some embodiments, flowable filler material 514 will shrink as it is cured, due to the loss of its solvent. As a result, during operation 303, the thickness of filler material 514 will normally be reduced from nascent thickness $t_1$ to its final thickness $t_B$. Typically the thickness of compliant medium and the plugs have the same thickness (i.e., $t_B$ is typically equal to $t_A$) and plugs 202 physically connect and thermally couple surfaces 516 and 518. In some embodiments, however, the thicknesses of the compliant medium and plugs are different. Preferably, however, plugs 202 physically connect surfaces 516 and 518 to facilitate heat flow through the thickness of the interposer. In embodiments, the thickness of at least one of compliant medium 204 and plugs 202 is based on the thermal expansion coefficients of each material.

Figure 5D:
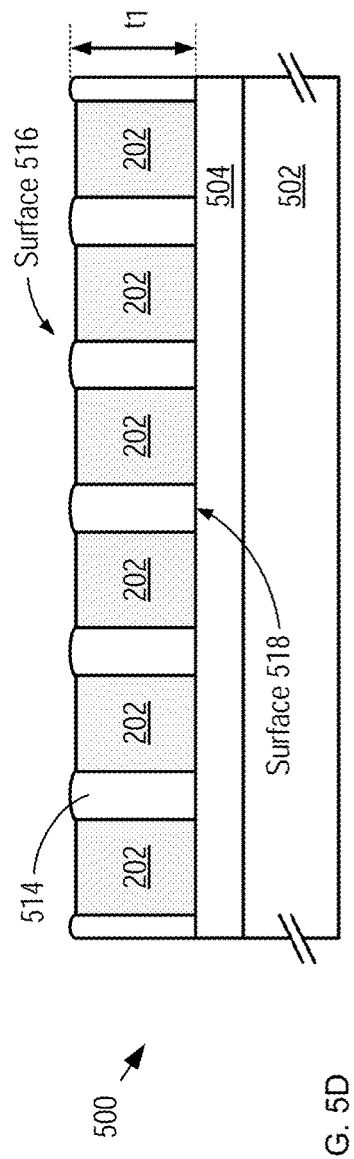

FIG. 5D depicts interposer 102 after the curing of filler material 514.

Once the filler material is fully cured, compliant medium 204 and plugs 202 collectively define compliant layer 206. By virtue of the flexibility of the cured filler material, compliant medium 204 physically couples plugs 202, yet affords compliant layer 206 an ability to expand and contract within the x-y plane, as well as bend out of the x-y plane, to accommodate thermal-expansion coefficient (TCE) mismatches between materials on either side of interposer 102.

In some embodiments, compliant medium 204 is formed by a process other than flowing a curable liquid, such as drop-casting, evaporating, sputtering, chemical vapor deposition, etc.

At operation 304, dielectric layer 208-1 is formed on surface 516 of compliant layer 206. Dielectric layer 208-1 includes a material that enables good thermal contact between interposer 102 and either of dies 104-1 and 104-2. In the depicted example, dielectric layer 208-1 is a layer of poly(methyl methacrylate) (PMMA) having a thickness of approximately 50 nanometers (nm). The typical thickness of dielectric layer 208-1 is within the range of tens to hundreds of nm; however, it can have other thicknesses without departing from the scope of the present invention. In some embodiments, dielectric layer 208-1 comprises a different electrically insulating material. Materials suitable for use in dielectric layer 208-1 include, without limitation, hydrogen silsesquioxane, other insulating polymers, and the like.

At operation 305, compliant layer 206 and dielectric layer 208-1 are released from handle wafer 502 by removing release layer 504 in a suitable sacrificial etch. In the depicted example, release layer 504 is a layer of silicon dioxide; therefore, an exemplary sacrificial etch is hydrofluoric acid. Preferably, the removal of release layer 504 does not substantially degrade any of the materials included in compliant layer 206.

In some embodiments, handle wafer 502 is a glass substrate on which active layer 506 is directly disposed (i.e., no BOX layer is included in the structure). In such embodiments, release of compliant layer is performed in substantially the same way. Preferably, a glass substrate used as handle wafer 502 is kept as thin as possible while retaining sufficient mechanical strength to withstand the stresses induced on it during processing. Typically, such a glass substrate has a thickness within the range of approximately 50 microns to 200 microns.

In some embodiments, fabrication of interposer 104 is complete once dielectric layer 208-1 has been formed and the composite layer is removed from handle substrate 502. In some embodiments, in which plugs 202 comprise an electrically non-conductive material, formation of dielectric layer 208-1 is optional and the interposer can be removed from the substrate prior to operation 304.

At optional operation 306, interposer 102 is temporarily mounted, dielectric-layer side down, on handle substrate 520. Handle substrate 520 enables additional processing operations, such as spin-coating, layer deposition, and the like, to be performed on the compliant layer.

Figure 5E:
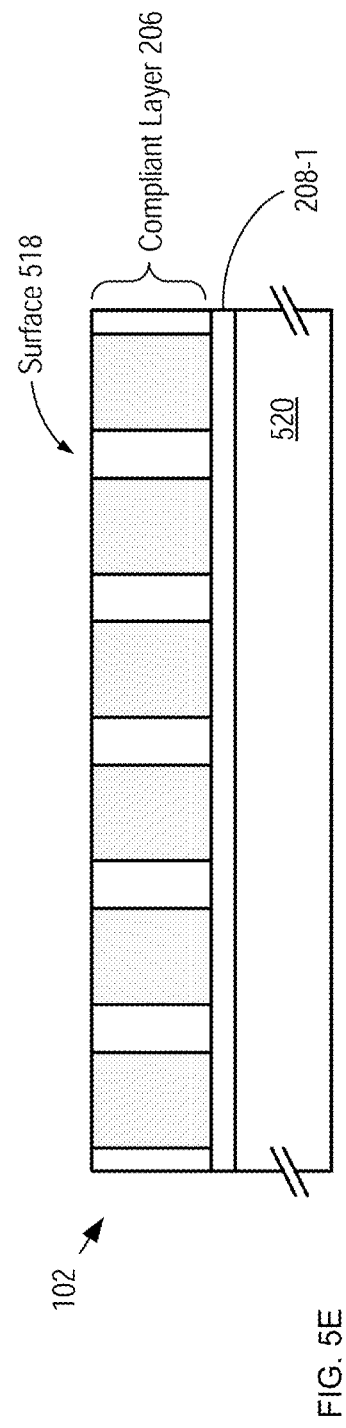

FIG. 5E depicts interposer 102 while mounted on handle substrate 520.

At optional operation 307, dielectric layer 208-2 is formed on surface 518 of compliant layer 206. Dielectric layer 208-2 is analogous to dielectric layer 208-1 described above.

Once dielectric layer 208-2 is formed, interposer 102 is removed from handle substrate 520. The fully formed interposer can be handled much like a conventional tape, cut to a desired size, and positioned as desired to enable mounting of semiconductor dies 104-1 and 104-2.

Figure 5F:
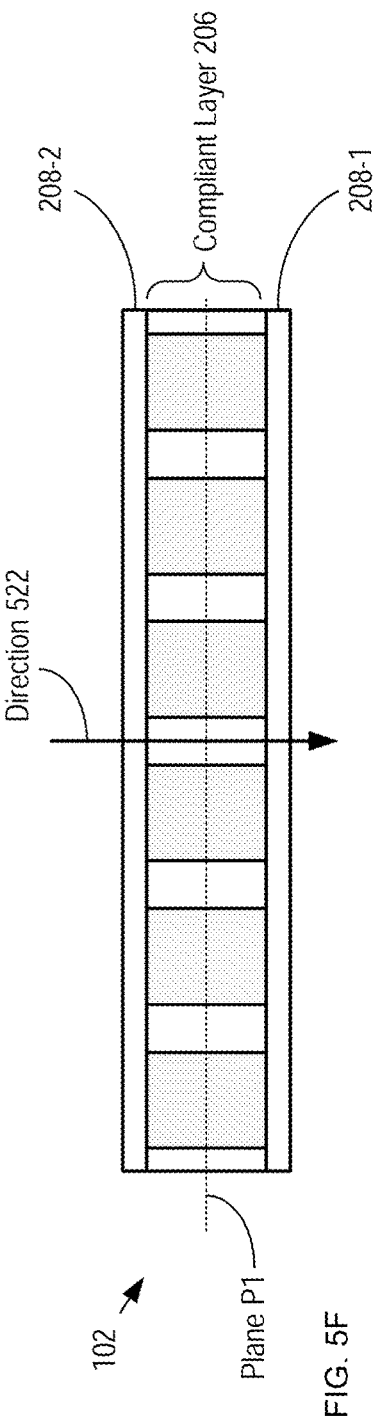

FIG. 5F depicts interposer 102 after formation of dielectric layer 208-2.

In some embodiments, plugs 202 and compliant medium 204 comprise materials that are electrically insulating. In such embodiments, dielectric layers 208-1 and 208-2 are not necessary but can be optionally included.

Once dielectric layers 208 are formed, interposer 102 has a thickness that is equal to the combined thicknesses of compliant layer 206 and dielectric layers 208-1 and 208-2.

Once fully formed, interposer 102 is affixed to the top surface of die 104-2 and die 104-1 is then affixed to the top surface of interposer 102 to complete vertically integrated package 100. By virtue of plugs 202, interposer 102 readily enables heat flow between surfaces 516 and 518 and, therefore, between dies 104-1 and 104-2. Typically, interposer 102 has a thermal conductivity along directions aligned with 522 (i.e., along paths between surfaces 516 and 518) that is higher than along directions aligned with plane P1 due to the presence of less thermally conductive filler material 514 between plugs 202. In some embodiments, plugs 202 are separated by only very thin regions of filler material to reduce the directional dependence of the thermal conductivity of interposer 102.

Figure 7:
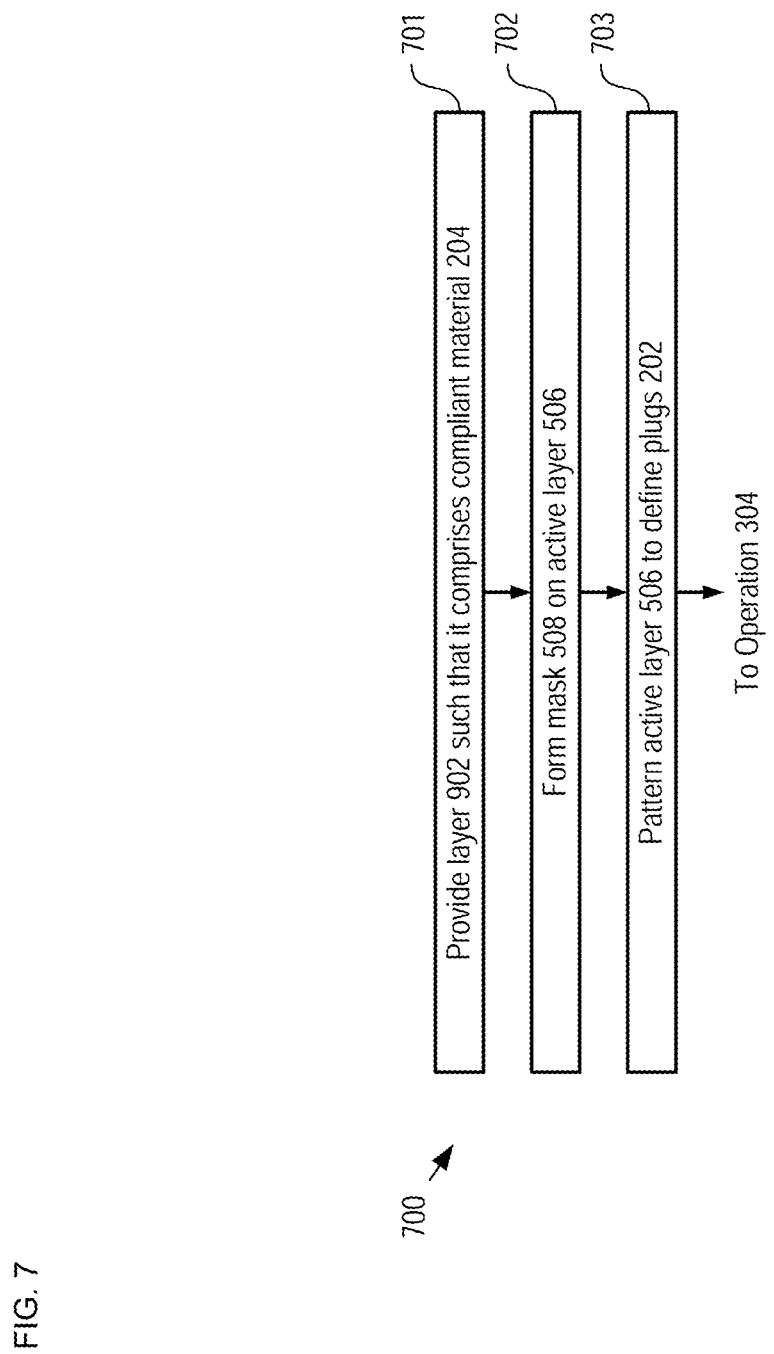
FIG. 7 depicts operations of a method for forming an interposer in accordance with an alternative embodiment of the present invention.

FIG. 7 depicts operations of a method for forming an interposer in accordance with an alternative embodiment of the present invention. Method 700 begins with operation 701, wherein a layer of fully cured filler material is provided.

FIGS. 8A-C depict schematic diagrams of cross-sectional views of an interposer at different stages of its fabrication in accordance with the alternative embodiment of the invention. Interposer 800 is analogous to interposer 102 described above.

Layer 802 is a layer of fully cured filler material 514 having thickness $t_B$. Layer 802 is disposed on release layer 504, which is disposed on handle substrate 502.

FIG. 8A depicts layer 802 in its original state.

At operation 702, layer 802 is patterned to define mold 804. Mold 804 includes cavities 806, each of which extends to release layer 504 and has the desired dimensions of one of the thermally conductive plugs of interposer 800.

FIG. 8B depicts interposer 800 after the definition of mold 804.

At operation 703 cavities 806 are filled with thermally conductive material to form plugs 808. Plugs 808 are analogous to plugs 202 described above; however, plugs 808 include a material that can be formed (e.g., selectively grown, electro-formed, deposited, etc.) in cavities 806, such as a polycrystalline semiconductor (e.g., polysilicon, etc.), a metal (e.g., gold, nickel, etc.), and the like. In operation 703, cavities 806 are filled such that the thickness of plugs 808 is the same as the thickness of the regions of filler material that define cavities 806 (i.e., $t_A$ is equal to $t_B$), as described above and with respect to interposer 102. In some embodiments, plugs 808 are filled to a different thickness. In some embodiments, surface 810 is lapped or polished to define a substantially planar surface. Surfaces 810 and 812 are analogous to surfaces 516 and 518 described above.

FIG. 8C depicts interposer 800 after the formation of plugs 808.

It should be noted that once plugs 808 are fully formed, the material of mold 804 defines compliant medium 204, as described above.

At the conclusion of operation 703, method 700 continues with the operations of method 300, beginning with operation 304, as described above.

In some embodiments, layer 802 is a layer of mold material that is removed after the formation of plugs 808. In such embodiments, compliant medium 204 is formed in the regions between plugs 808 as described above and with respect to operations 302 and 303.

Figure 9:
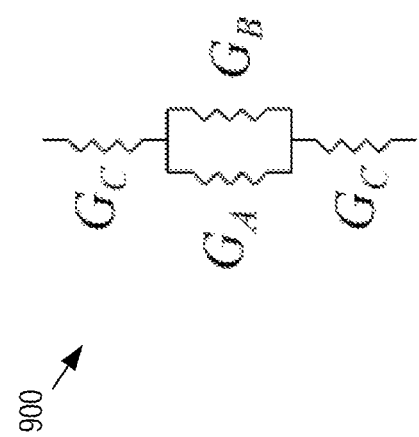
FIG. 9 provides a thermal conductivity model of interposer 102.

FIG. 9 provides a thermal conductivity model of interposers 102 and 800. Using model 900, the thermal conductance of interposer 102 can be compared to a prior-art underfill layer composed of a benchmark material having a thermal conductivity of approximately 4 W·m$^{-1}$·K$^{-1}$.

For a region having a size of 1×1 cm$^2$ cross-sectional area, the thermal conductances, $G_A$ and $G_B$, of region A and region B, respectively, can be calculated by considering the porosity factor of compliant layer 206 as:

$$G_A = \phi_A \times \frac{K_A}{t_A} \quad (2)$$

$$G_B = (1 - \phi_A) \times \frac{K_B}{t_B} \quad (3)$$

where, $\phi_A$ is the porosity of the material of plugs 202, $K_A$ is the cross-plane thermal conductivity of the material of plugs 202 (i.e., of region A), and $K_B$ is the cross-plane thermal conductivity of the material of compliant medium 204 (i.e., of region B).

The thermal conductance, G, of a 1×1 cm$^2$ sample of interposer 102 can be calculated using model 210 as:

$$G = \left( \frac{1}{(G_A + G_B)} + \frac{2}{G_C} \right)^{-1}. \quad (4)$$

FIG. 10 depicts a table of exemplary materials, dimensions, and material characteristics for an interposer in accordance with the present invention and a benchmark layer of conventional underfill materials. Using the information provided in table 1000 and equations (2)-(4), an interposer 102, having an area of 1×1 cm$^2$ and a thickness, $t_A$, of 20.1 microns, is found to have an estimated overall thermal conductance of approximately 130 W·K$^{-1}$·cm$^{-2}$ and an effective thermal conductivity of approximately 26.2 W·m$^{-1}$·K$^{-1}$.

By comparison, the thermal conductance of a prior-art underfill film having the same dimensions is found to have an estimated overall thermal conductance of approximately 25 W·K$^{-1}$·cm$^{-2}$ and an effective thermal conductivity of approximately 4 W·m$^{-1}$·K$^{-1}$. Interposer 102, therefore, provides about a 5-fold increase in thermal conductance and thermal conductivity, as compared to that of a conventional underfill layer as is commonly used in the semiconductor industry. It should be noted that the porosity of compliant layer 206 (i.e., the ratio of d/s as indicated in FIG. 2) can be increased to further improve the performance of interposer 102.

Although the illustrative embodiment comprises a compliant layer that is periodic with $\phi_A$=0.51, it will be clear to one skilled in the art, after reading this Specification, how to specify, make, and use alternative embodiments wherein compliant layer 206 is aperiodic in at least one dimension and/or has a different value of $\phi_A$. Further, in some embodiments, plugs 202 are of different sizes and/or shapes. In some embodiments, plugs 202 are located within the x-y plane such that they have a higher concentration in one or more regions (e.g., where die attachment is anticipated) in order to facilitate accommodation of high heat-flux regions and hot spots within system 100.

It is to be understood that the disclosure teaches just one example of the illustrative embodiment and that many variations of the invention can easily be devised by those skilled in the art after reading this disclosure and that the scope of the present invention is to be determined by the following claims.

What is claimed is:

1. A method for forming an interposer, the method comprising forming a compliant layer via operations that include:
   forming a plurality of plugs within a first plane, the plurality of plugs being disposed on a handle substrate, each of the plurality of plugs comprising a first material that is thermally conductive, wherein each plug is physically disconnected from each other plug of the plurality thereof within the first plane;
   forming a compliant medium, the compliant medium surrounding each plug of the plurality thereof in the first plane;
   removing the handle substrate; and
   forming a second layer on an entire first surface of the compliant layer, the second layer comprising a material that is substantially electrically insulating.

2. The method of claim 1, wherein the plurality of plugs is formed via operations that include:
   providing the handle substrate such that it includes a first layer, wherein the first layer comprises the first material;
   patterning the first layer to define the plurality of plugs.

3. The method of claim 1, wherein the plurality of plugs is formed via operations that include:
   forming a second layer, the second layer having a plurality of cavities, wherein each cavity is disconnected from each other cavity of the plurality thereof, and wherein the second layer and plurality of cavities collectively define the compliant medium; and
   filling the plurality of cavities with the first material.

4. The method of claim 1, wherein the compliant medium is formed via operations that include:

flowing a second material into a region that surrounds each of the plurality of plugs in the first plane; and curing the second material.

5. The method of claim 1 wherein the first material is selected from the group consisting of semiconductors, metals, and single-crystal oxides.

6. The method of claim 1, further comprising:

forming a third layer on a second surface of the compliant layer, the third layer comprising a material that is substantially electrically insulating, wherein the second surface is distal to the first surface.

7. The method of claim 6 wherein the material composing the third layer is selected from the group consisting of poly(methyl methacrylate) (PMMA) and hydrogen silsesquioxane.

8. The method of claim 1 wherein the compliant medium is selected from the group consisting of Parylene and poly(methyl methacrylate) (PMMA).

9. A method for forming an interposer, the method comprising forming a compliant layer via operations, the method comprising:

forming, in a layer of a thermally conductive material of a handle substrate, a plurality of thermally conductive plugs by patterning the layer to define the plurality of plugs;

forming, around each plug of the plurality thereof, a compliant layer comprising a compliant medium;

removing the handle substrate; and forming, on an entire first surface of the compliant layer, a layer of a material that is substantially electrically insulating.

10. The method of claim 9, wherein the thermally conductive material is selected from the group consisting of semiconductors, metals, and single-crystal oxides.

11. The method of claim 9 wherein forming the compliant medium further comprises:

flowing a second material into a region that surrounds each of the plurality of plugs; and curing the second material.

12. The method of claim 11 wherein the second material is selected from the group consisting of Parylene and poly(methyl methacrylate) (PMMA).

13. The method of claim 9, further comprising:

forming, on a second surface of the compliant layer, a layer of a material that is substantially electrically insulating.

* * * * *